(12) United States Patent
Danielson et al.

(10) Patent No.: US 7,087,996 B2
(45) Date of Patent: Aug. 8, 2006

(54) ETCHANT FORMULATION FOR SELECTIVELY REMOVING THIN FILMS IN THE PRESENCE OF COPPER, TIN, AND LEAD

(75) Inventors: Donald Danielson, Forest Grove, OR (US); Tzeun-luh Huang, Portland, OR (US); Dawn L. Scovell, Beaverton, OR (US); Keith Willis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 169 days.

(21) Appl. No.: 10/867,886

(22) Filed: Jun. 14, 2004

(65) Prior Publication Data

US 2004/0224518 A1 Nov. 11, 2004

Related U.S. Application Data

(62) Division of application No. 10/003,240, filed on Oct. 26, 2001, now Pat. No. 6,749,760.

(51) Int. Cl.
*H01L 23/48* (2006.01)

(52) U.S. Cl. ............... 257/737; 257/738; 257/778; 257/780

(58) Field of Classification Search ............... None
See application file for complete search history.

(56) References Cited

U.S. PATENT DOCUMENTS

| | | | |
|---|---|---|---|
| 5,211,807 A * | 5/1993 | Yee | 216/100 |
| 5,223,087 A * | 6/1993 | Itani et al. | 216/108 |
| 5,259,888 A | 11/1993 | McCoy | 134/2 |
| 5,462,638 A | 10/1995 | Datta et al. | 438/695 |
| 5,869,130 A | 2/1999 | Ferrier | 427/98 |
| 6,054,061 A | 4/2000 | Bayes et al. | 216/13 |
| 6,083,419 A | 7/2000 | Grumbine et al. | 252/79.1 |
| 6,130,170 A | 10/2000 | David et al. | 438/745 |
| 6,136,711 A | 10/2000 | Grumbine et al. | 438/692 |
| 6,238,589 B1 * | 5/2001 | Cooper et al. | 216/84 |
| 6,293,457 B1 | 9/2001 | Srivastava et al. | 228/254 |
| 6,538,323 B1 * | 3/2003 | Sakata et al. | 257/737 |

FOREIGN PATENT DOCUMENTS

WO WO-96/19097 6/1996

OTHER PUBLICATIONS

Lipetzky, Pete , "Refractory Metals: A Primer", *Journal of Metals*, The Metallurgical Society, (Mar. 2002), 47-49.

* cited by examiner

*Primary Examiner*—Thanh Nguyen
(74) *Attorney, Agent, or Firm*—Schwegman, Lundberg, Woessner & Kluth, P.A.

(57) ABSTRACT

The invention relates to a ball-limiting metallurgy (BLM) etching system and process. The BLM stack is provided for an electrical device that contains an aluminum layer disposed upon a metal first layer. A metal upper layer is disposed above the metal second layer, and an alternative metal third layer is disposed between the metal second layer and the metal upper layer. The etching system and process utilizes an etching solution that includes a nitrogen-containing heterocyclic compound, an ammonium hydroxide compound, an oxidizer, and a metal halide compound. Etching conditions prevent any metallization that is dissolved from redepositing, thus avoiding lowered yields.

13 Claims, 4 Drawing Sheets

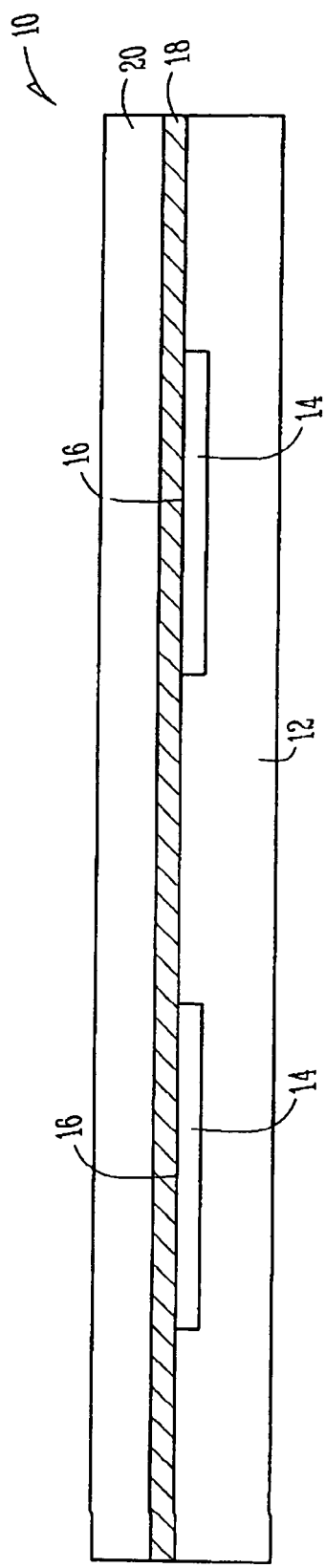
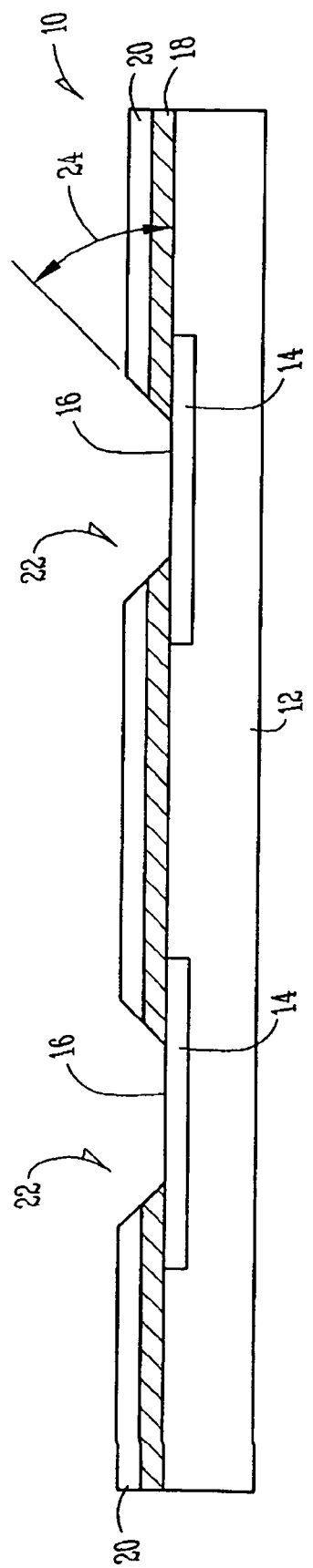

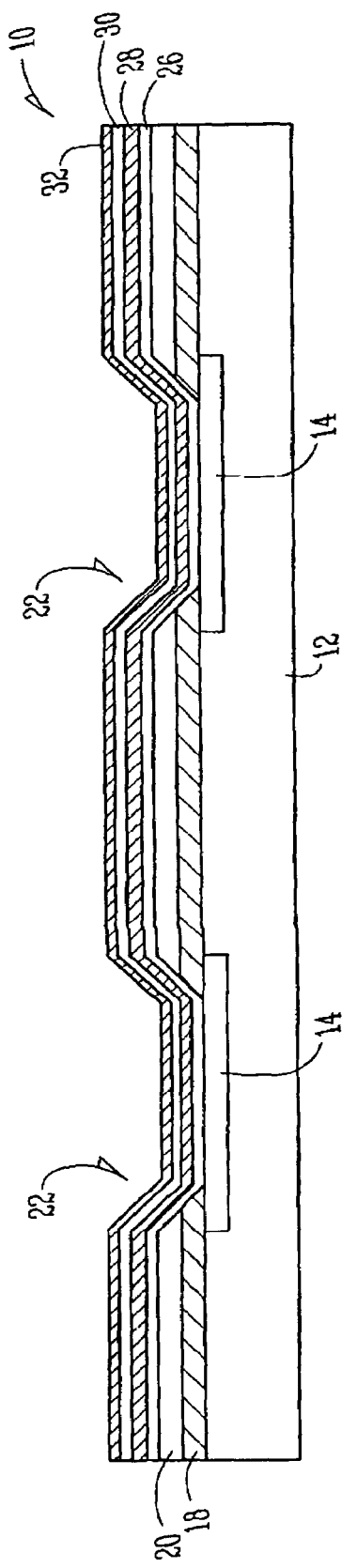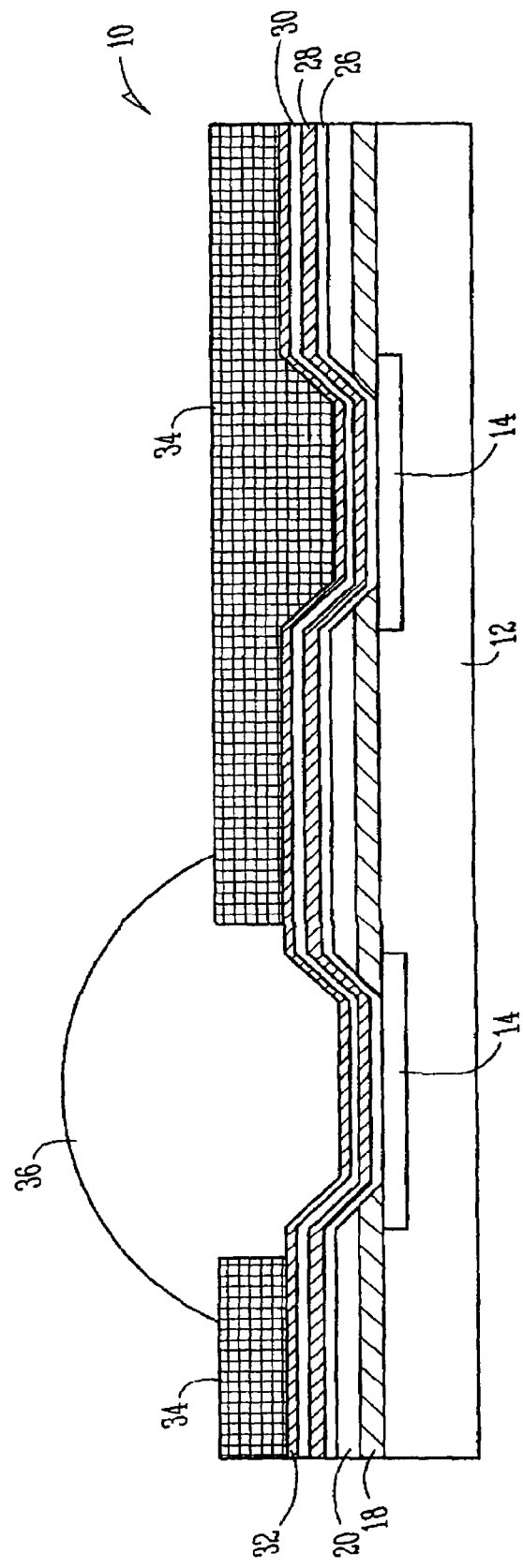

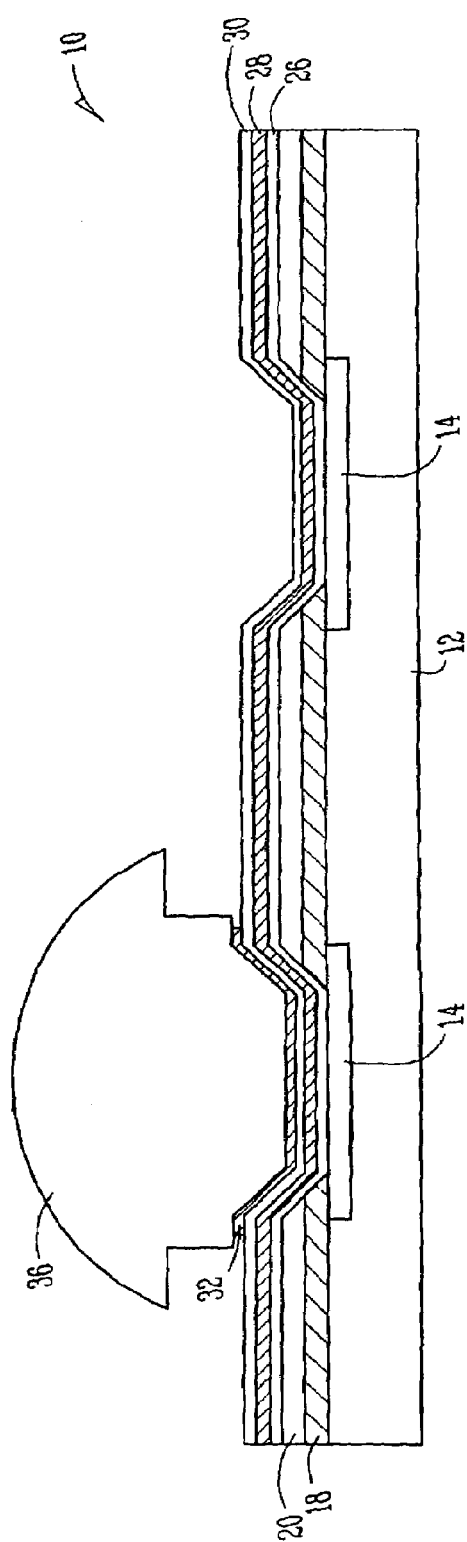
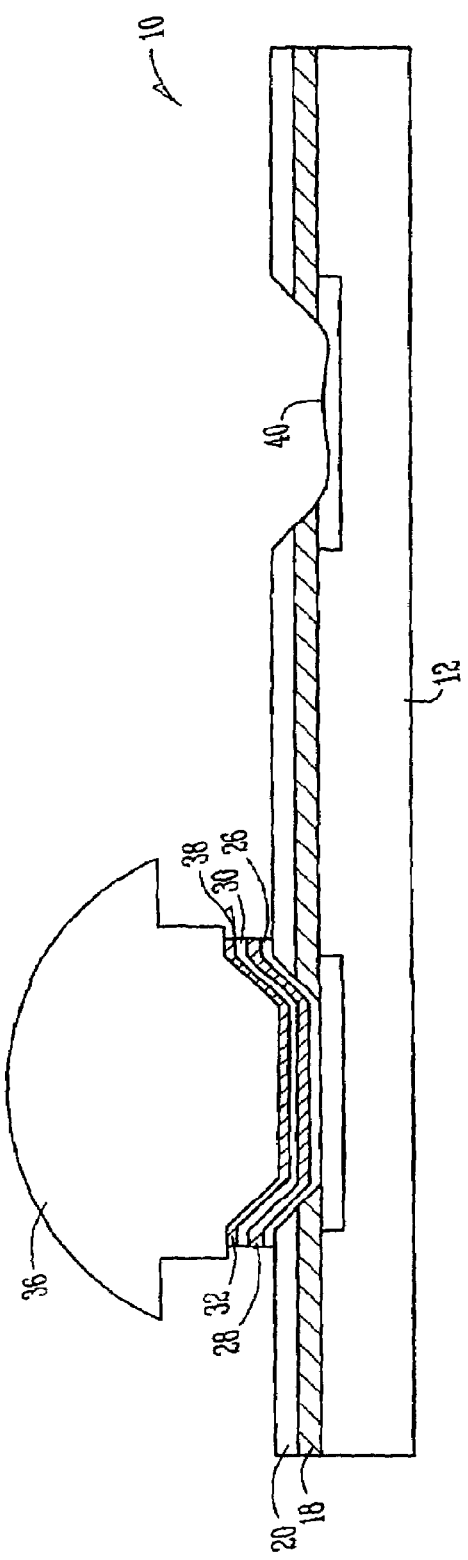

US 7,087,996 B2

ETCHANT FORMULATION FOR SELECTIVELY REMOVING THIN FILMS IN THE PRESENCE OF COPPER, TIN, AND LEAD

This application is a divisional of U.S. patent application Ser. No. 10/003,240, filed Oct. 26, 2001, now U.S. Pat. No. 6,749,760 which is incorporated herein by reference in its entirety.

BACKGROUND OF THE INVENTION

1. Field of the Invention

An embodiment of the present invention relates generally to integrated circuit fabrication. More particularly, an embodiment of the present invention relates to electrical connection technology. In particular, an embodiment of the present invention relates to etching a ball-limiting metallurgy in the presence of lead, tin, and copper.

2. Description of Related Art

Electrical bump connectors such as metal bumps or balls are used in flip-chip (C4) applications. As the progress of miniaturization continues, the junction between a microelectronic device metallization and the electrical bump becomes increasingly large relative to the mass of the electrical bump. Consequently, junction disparities have an increasingly detrimental effect on electrical communication between the device and the electrical bump.

Etching of the metal layer or layers exposes a portion of the metallization pads and often leaves residual titanium on the passivation layer. Etching also mobilizes portions of the metallization pads and redeposits them on the passivation layer. The redeposited metallization pad material and the residual titanium may form stringers or other structures that may lead to electrical test (e-test) failures or field failures.

BRIEF DESCRIPTION OF THE DRAWINGS

In order that the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which:

FIG. 1 is an elevational cross-section of a semiconductor structure that reveals metallization according to an embodiment of the invention;

FIG. 2 is an elevational cross-section of the semiconductor structure depicted in FIG. 1 after patterning of a passivation layer;

FIG. 3 is an elevational cross-section of the semiconductor structure depicted in FIG. 2 after further processing;

FIG. 4 is an elevational cross-section of the semiconductor structure depicted in FIG. 3 after further processing;

FIG. 5 is an elevational cross-section of the semiconductor structure depicted in FIG. 4 after further processing;

FIG. 6 is an elevational cross-section of the semiconductor structure depicted in FIG. 5 after further processing.

DETAILED DESCRIPTION OF THE INVENTION

Figure 7:
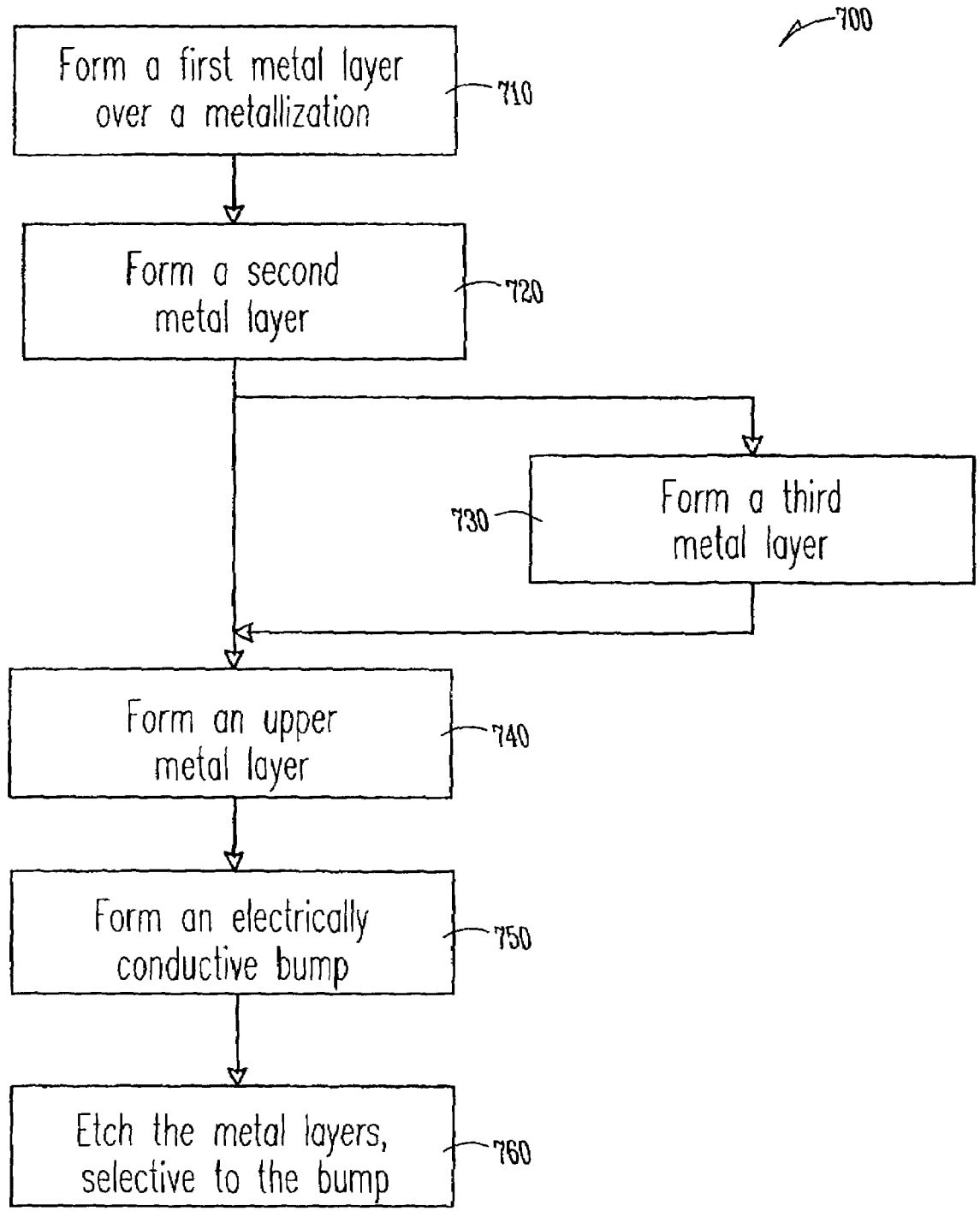
FIG. 7 is a chart that describes a process flow embodiment.

The present invention relates to an etch process flow and an etching solution that etches a ball-limiting metallurgy (BLM) stack. In one embodiment, an etch recipe including n-methyl pyrrolidone (NMP), tetra methyl ammonium hydroxide (TMAH), hydrogen peroxide ($H_2O_2$), and potassium fluoride (KF). The etch recipe is selective to the lead-tin bumps and the copper pads.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of embodiments of the present invention most clearly, the drawings included herein are diagrammatic representations of integrated circuit structures. Thus, the actual appearance of the fabricated structures, for example in a photomicrograph, may appear different while still incorporating the essential structures of embodiments of the present invention. Moreover, the drawings show only the structures necessary to understand embodiments of the present invention. Additional structures known in the art have not been included to maintain the clarity of the drawings.

FIG. 1 is a cross-section of a semiconductor structure 10 during fabrication that includes a substrate 12 and metallization 14 such as copper pads that make connection to what is commonly referred to as metal six (M6) by way of non-limiting example. Metallization 14 may be disposed with an upper surface 16 that is coplanar with substrate 12 where substrate 12 may be an interlayer dielectric (ILD) composition. A nitride layer 18 and a passivation layer 20 are formed over substrate 12 and metallization 14. Nitride layer 18 and passivation layer 20 act to protect substrate 12 and to expose metallization 14 according to the patterning. Passivation layer 20 may be a polyimide material or it may be an inorganic material such as a silicon oxide that is formed by the decomposition of tetraethyl ortho silicate (TEOS). Patterning is accomplished by a first mask (not pictured) that exposes passivation layer 20.

FIG. 2 illustrates a patterned passivation structure, that includes portions of nitride layer 18 and passivation layer 20, and that exposes a portion of metallization 14. The process may be carried out by blanket forming nitride layer 18 and passivation layer 20, patterning, etching recess 22, and curing passivation layer 20 where passivation layer 20 is a polyimide. In one embodiment after the cure, passivation layer 20 has formed a slope 24 that has an angle, in a range from about 30° to about 60°. In one embodiment after the cure, passivation layer 20 has formed slope 24 that is about 45°.

FIG. 3 illustrates further processing that is carried out where passivation layer 20 and metallization 14 are covered with a metal first layer 26 a metal second layer 28, a metal third layer 30, and a metal upper layer 32. In one embodiment, metal first layer 26 is a refractory metal such as titanium, zirconium, hafnium, and the like. Other refractory metals for metal first layer 26 include nickel, cobalt, palladium, platinum, and the like. Other refractory metals for metal first layer 26 include chromium, molybdenum, tungsten, and the like. Other refractory metals for metal first layer 26 include scandium, yttrium, lanthanum, cerium, and the like. One property embodiment is a metal first layer 26 that exhibits sufficient adhesion to the metallization that liftoff or spalling thereof will not occur during fabrication, test, and ordinary field use.

In one embodiment, metal first layer 26 is titanium that is formed by physical vapor deposition (PVD) to a thickness in a range from about 500 Å to about 2,000 Å. In another embodiment, metal first layer 26 is PVD titanium that is formed to a thickness of about 1,000 Å. In another embodiment, metal first layer 26 is chromium that is formed by PVD to a thickness in a range from about 500 Å to about 2,000 Å. In another embodiment, metal first layer is PVD chromium that is formed to a thickness of about 1,000 Å.

Metal second layer 28 is formed by PVD according to known technique. In one embodiment, metal second layer 28 has a thickness in a range from about 500 Å to about 4,000 Å. In one embodiment, metal second layer 28 has a thickness in a range from about 750 Å to about 2,000 Å. In one embodiment, metal second layer 28 has a thickness of about 1,000 Å. In one embodiment, metal second layer 28 is Al and the like. In another embodiment, metal second layer 28 is selected from Ti, doped Ti, TiW, and the like. In another embodiment, metal second layer 28 is selected from Zr, Hf, and the like. Metal second layer 28 acts as a tin diffusion barrier and thermo-mechanical buffer layer.

Metal second layer 28 is covered with metal third layer 30 that is substantially the same metal as metal first layer 26. In one embodiment, metal third layer 30 is formed by PVD according to known technique. In one embodiment, metal third layer 30 is substantially the same composition as metal first layer 26, within usual process variations. Alternatively, metal third layer 30 is substantially the same metal type as metal first layer 26 according to grouping as set forth herein. Accordingly, "substantially the same metal" or "substantially the same composition" may be referred to as substantially the same metal type according to grouping as set forth herein.

In one embodiment, metal first and third layers 26, 30 are Ti, and metal upper layer 32 is NiV. Sputtering of the metal layers 26-32 may be carried out under sputtering conditions that will cause them, or one or more of them, to carry a compressive stress that will resist liftoff from passivation layer 24 Such processing conditions are known in the art.

FIG. 3 also illustrates further processing in which metal upper layer 32 is formed over metal second layer 28. In one embodiment, metal upper layer 32 is a refractory metal, a refractory metal alloy, or a doped refractory metal. The refractory metal alloy or the doped metal is in stoichiometric or solid solution ratios. In one embodiment, metal upper layer 32 is a vanadium-alloyed or vanadium-doped metal of at least one metal selected from nickel, cobalt, palladium, platinum, and the like. The vanadium may be added where the metal may be ferroelectric. In one embodiment, metal upper layer 32 is a metal, a vanadium-alloyed, or vanadium-doped metal of at least one selected from titanium, zirconium, hafnium, and the like. In another embodiment, metal upper layer 32 is a metal, a vanadium-alloyed, or vanadium-doped metal of at least one selected from chromium, molybdenum, tungsten, and the like. In another embodiment, metal upper layer 32 is a metal, a vanadium-alloyed, or vanadium-doped metal of at least one selected from scandium, yttrium, lanthanum, cerium, and the like.

In one embodiment, metal upper layer 32 is a refractory metal, a refractory metal-vanadium alloy, or vanadium-doped metal that is formed by PVD to a thickness in a range from about 1,000 Å to about 4,000 Å. In another embodiment, metal upper layer 32 is formed by PVD to a thickness of about 2,000 Å. In one embodiment, metal upper layer 32 is a NiV alloy. In another embodiment, metal upper layer 32 is a vanadium-doped nickel layer.

Although sputtering of the metal layers 26–32 is a process flow embodiment, evaporation deposition of a composition such as an organometallic material is also used as a process flow embodiment as known in the art.

In an alternative embodiment, metal upper layer 32, is nitrided to form a nitrided metal alloy or a nitrided vanadium-doped metal as set forth herein. Nitriding conditions may be carried out according to known technique for nitridation of metals. In selected embodiments, metal upper layer 32 is a nitrided refractory metal-vanadium alloy or a nitrided, vanadium-doped refractory metal. In other selected embodiments, metal upper layer 32 is a nitrided NiV alloy or a nitrided vanadium-doped nickel metal.

In another embodiment, metal first and third layers 26, 30, have thicknesses in arbitrary units in a range from about 500 to about 2,000, preferably about 1,000. Similarly, metal second layer 28 has a thickness in arbitrary units in a range from about 500 to about 4,000, preferably from about 750 to about 2,000, and more preferably about 1,000. Further, metal upper layer 32 has a thickness in a range from about 500 to about 6,000, preferably from about 1,000 to about 5,000. As miniaturization technology progresses the ratios of the metal layers may be formed according to these proportionalities.

One metal stack embodiment includes metal first layer 26 of Ti at about 1,000 Å, metal second layer 28 of Al at about 1,000 Å, metal third layer 30 of Ti at about 1,000 Å, and metal upper layer 32 of nitrided NiV at about 4,000 Å. Another metal stack embodiment includes metal first layer 26 of Ti at about 500 Å, metal second layer 28 of Al at about 1,000 Å, metal third layer 30 of Ti at about 500 Å, and metal upper layer 32 of nitrided NiV at about 2,000 Å.

Another metal stack embodiment includes metal first layer 26 of Ti at about 1,000 Å, metal second layer 28 selected from doped Ti, Ti, and TiW at about 1,000 Å, metal third layer 30 of Ti at about 1,000 Å, and metal upper layer 32 of nitrided NiV at about 4,000 Å. Another metal stack embodiment includes metal first layer 26 of Ti at about 500 Å, metal second layer 28 selected from doped Ti, doped Ti, and TiW at about 1,000 Å, metal third layer 30 of Ti at about 500 Å, and metal upper layer 32 of nitrided NiV at about 2,000 Å.

Another metal stack embodiment includes metal first layer 26 of Ti at about 1,000 Å, metal second layer 28 selected from Zr and Hf at about 1,000 Å, metal third layer 30 of Ti at about 1,000 Å, and metal upper layer 32 of nitrided NiV at about 4,000 Å. Another metal stack embodiment includes metal first layer 26 of Ti at about 500 Å, metal second layer 28 selected from Zr and Hf, and TiW at about 1,000 Å, metal third layer 30 of Ti at about 500 Å, and metal upper layer 32 of nitrided NiV at about 2,000 Å.

In an alternative embodiment, metal third layer 30 is omitted. Consequently, the BLM stack includes metal first layer 26, metal second layer 28 and metal upper layer 32 with the various compositional and thickness embodiments as set forth herein.

Following the formation of the metal layers 26-32 as set forth herein, processing may continue by plating a bump precursor over the four-metal-layer stack similar to semiconductor structure 10 depicted in FIG. 4 according to various process flow embodiments. Further processing as set forth herein may result in a solder ball (not pictured). Because some intermetallic material may form between the solder ball and metallization 14, the metal layers 26–32 act to prevent excessive intermetallic formation, and to resist tin migration toward metallization 14.

FIG. 4 illustrates further processing in which a second mask 34 is patterned to expose metal upper layer 32 where the exposure is substantially centered over metallization 14. Second mask 34 is peripherally patterned because a plating process is carried out to plate a bump precursor that adheres to metal upper layer 32. FIG. 3 also illustrates further processing in which a bump precursor button 36 has been plated over metal upper layer 32 through mask 34. Plating is carried out by electroless plating techniques or by electroplating techniques as is known in the art. By way of non-limiting example, electroplating is carried out to form bump precursor button 36 as a discrete structure that is spaced-apart from any closest neighboring bump precursors. Accordingly, bump precursor button 36 may have a curvilinear perimeter (not pictured) and a curvilinear vertical profile. Alternatively, a plating film may be formed and subsequently patterned into substantially discrete bump precursor structures by a process such as an etch. Accordingly, the bump precursor structure may have a rectilinear perimeter (not pictured) and a rectilinear vertical profile (also not pictured). In any event, bump precursor button 34 or a patterned bump precursor structure (not depicted) may be selected from a solder composition that facilitates embodiments.

It is noted in FIGS. 1–4 that one occurrence of metallization 14 has no bump precursor button 36 due to the patterning of mask 34 that has prevented deposition of solder material. In such an event, the metallization without a bump precursor button may act as a probe site for testing or other functions.

In one embodiment, bump precursor button 36 is a tin-lead solder. In selected embodiments, bump precursor button 36 is a tin-lead solder composition such as from Sn97Pb. A tin-lead solder composition that may be used with a substrate that is to be flip-chip mounted over semiconductor structure 10 is a Sn37Pb composition. In any event, bump precursor button 36 may be a tin-lead solder comprising $Sn_xPb_y$, wherein x+y total 1, and wherein x is in a range from about 0.3 to about 0.99. Preferably, the bump precursor button 36 is a tin-lead solder composition of Sn97Pb, and substrate solder for forming the C4 bond is a tin-lead solder composition of Sn37Pb.

FIG. 5 illustrates further processing in which metal upper layer 32 has been removed to expose metal third layer 30 except for the region directly under bump precursor button 36. Metal upper layer 32 is removed by a wet etch as is known in the art. For example, where metal upper layer 32 is a nitrided NiV material, a wet etch recipe is chosen that is selective to both bump precursor button 36 and to metal third layer 30. One non-limiting example of such a wet etch recipe is a wet sulphonic etch as is known in the art.

FIG. 6 illustrates further etching in which the three metal layers 26, 28, and 30 are removed substantially everywhere except directly under bump precursor button 36. Although some undercutting 38 into the metal layers 26-32 beneath bump precursor button 36 may be desirable, it may be balanced against risking a total slumping of the solder during reflow. In one embodiment, the etch recipe results in undercutting 38 of metal upper layer 32 is about 2.5 microns, undercutting 38 of metal third layer 30 and metal first layer is about 8 microns each, and undercutting 38 of metal second layer 128 is about 9 microns.

Etching of metal first layer 26-through metal third layer 30 is carried out according to various embodiments. In one embodiment, etching a is carried out in the presence of a nitrogen-containing heterocyclic compound, an ammonium hydroxide compound, an oxidizer, and a metal halide compound.

The nitrogen-containing heterocyclic compound is selected from pyrrole, imidazole, oxazole, thizole, pyrazole, 3-pyrroline, pyrrolidine, n-methyl pyrrolidone (NMP) and the like. Other organic compounds may be used that tend to stabilize the oxidizer. In one embodiment, a 100% NMP composition is provided in a ratio of about 5 volume parts NMP to 2 volume parts ammonium hydroxide compound, to about 2 volume parts oxidizer.

The ammonium hydroxide compound is selected from methyl ammonium hydroxide, tetra methyl amnnionium hydroxide (TMAH), and the like. In one embodiment, the amnionium hydroxide compound is 25% TMAH in water that is provided in a ratio of about 2 volume parts to about 5 volume parts nitrogen-containing heterocyclic compound, to about 2 volume parts oxidizer.

The oxidizer is selected from ozone, hydrogen peroxide, hydrogen peroxide-containing complexes such as carbamide peroxide $(NH_2)_2CO$—$H_2O_2$, and the like. Oxidizers can provide a ready source of active oxygen in effective concentrations. Oxidizers often have short shelf lives and therefore it is useful to provide point-of-use oxides that are mixed as they are to be metered to the etching tool. In one embodiment, the oxidizer is about 30% hydrogen peroxide in water that is provided in a ratio of about 2 volume parts hydrogen peroxide to about 5 volume parts nitrogen-containing heterocyclic compound to about 2 volume parts ammonium hydroxide compound.

In all of the etching solution embodiments, a metal halide compound or the like is provided. In one embodiment, the metal halide compound is a metal halide salt selected from alkali metal halide salts and alkaline earth metal halide salts. In one specific embodiment, the metal halide compound is potassium fluoride (KF) in a concentration range from about 3 gram/liter to about 5 gram/liter. In one embodiment the molar concentration of KF is about 0.063 mole/liter. In any event, the molar equivalent concentration in relation to the metal or the halide is in a range from about 0.05 mole equivalents/liter to about 0.1 mole equivalents/liter. Although no specific chemical mechanism is set forth herein for the metal halide compound, the mole equivalents concentration may be applicable to either the metal or the halide.

The following represents non-limiting embodiments of etch recipes according to the present invention. During etching, some of metallization 14 that is exposed dissolves and presents a potential contaminant that can deposit upon passivation layer 20. FIG. 6 illustrates a dished area 40, in an arbitrary shape, of metallization 14 that is exposed during etching of metal layers 26, 28, and 30. In these embodiments, etching through metal first layer 26, metal second layer 28, and metal third layer 30 is carried out under conditions that retain the dissolved portion of metallization 14 in an oxidized state such that it is not redeposited upon passivation layer 20. Some of these conditions include a pH in a range that is basic. In one embodiment, the pH is maintained in a range from about 7 to about 12. In one embodiment, the pH is maintained in a range from about 9 to about 11.

In one embodiment, the nitrogen-containing heterocyclic compound is NMP, the ammonium hydroxide compound is TMAH, the oxidizer is hydrogen peroxide, the metal halide compound is potassium fluoride. Although these specific compounds are set forth, it is understood that other compound types are included in various embodiments. Given these compounds, specifically referred to, but also generically classed as set forth herein, the etching solution the conditions include NMP:TMAH:$H_2O_2$ in a volume ratio that varies the NMP from about 8:5:2 to about 2:5:2. In another embodiment, the etching solution conditions include NMP:TMAH:$H_2O_2$ in a volume ratio that varies the TMAH from about 5:6:2 to about 5:4:2. In another embodiment, the etching solution conditions include NMP:TMAH:$H_2O_2$ in a volume ratio that, varies the $H_2O_2$ from about 5:5:3 to about 5:5:1. In another embodiment, the etching solution conditions include NMP:TMAH:$H_2O_2$ in a volume ratio of about 5:5:2.

It is noted that for the three variations of volume ratios for the respective nitrogen-containing heterocyclic-ammonium hydroxide- and oxidizer compounds, combinations of the three variations are embodiments of the present invention.

In one embodiment, certain thicknesses of the layers 26-32 are selected. The metal layers should not be too thin individually so that the BLM stack is consumed by the migration of tin or the like from the solder bump precursor button 36. Otherwise, during the temperature cycling, once the BLM stack is consumed, an intermetallic that forms, segregates and form shapes that may move upward into the solder. Consequently, volume changes that correspond with intermetallic formation may cause significant stress in the electrical structure. In one embodiment, the metal second layer 28 significantly resists combination of stack metals with tin in the tin-lead solder. Consequently, where significant consumption of metal upper layer 32 may occur, metal second layer 28 acts as a migration stop to tin in the solder ball that forms from bump precursor button 34.

The following is a process example that relates to semiconductor structure 10 as depicted in FIGS. 1–6. A substrate 12 containing an M6 metallization and a copper metallization 14 bond pad is provided. Substrate 12 contains a silicon oxide ILD material as is known in the art. A nitride layer 18 and a passivation layer 20 are formed over substrate 12 and metallization 14. Passivation layer 20 is a polyimide layer that is formed according to known technique. Thereafter, a photoresist first mask (not pictured) is spun on and patterned to expose a recess 22. Etching of passivation layer 20 is carried out in a dry etch. Thereafter, passivation layer 20 is cured such it shrinks in vertical dimension, and forms an angle 24 of about 45°. A metal first layer 26 is formed by PVD of Ti over substrate 12 and structures supported thereon. Metal first layer 26 is about 1,000 Å thick in the vertical dimension as depicted in FIG. 3. Next, a metal second layer 28 is formed by PVD over metal first layer 26. Metal second layer 28 is aluminum that is about 1,000 Å thick. A metal third layer 30 is formed by PVD of Ti to a thickness of about 1,000 Å. Thereafter, a metal upper layer 32 is formed by PVD of a NiV alloy over metal third layer 30. Metal upper layer 32 is about 4,000 Å. Nitriding of metal upper layer 32 is carried out under thermal processing conditions according to known technique.

After the formation of the metal layers 26-32, a photoresist mask 34 is spun on, cured, exposed, and patterned according to known technique. Patterning of mask 34 exposes metal upper layer 32 directly above metallization 14 on one side of the structure depicted in FIG. 4 (left), but mask 34 covers an occurrence of metallization 14 on the other side (right). Thereafter, an electroplating solution that has tin and lead in a Sn97Pb proportion is applied over substrate 12 until a bump precursor button 36 has been formed. Next, an isotropic wet etch is carried out that dissolves metal upper layer 32. The wet etch is a sulphonic acid or the like according to known technique that is selective to bump precursor button 36.

After etching of metal upper layer 32, a wet isotropic etch is carried out that removes first-through third metal layers 26, 28, and 30 as set forth herein. Etching temperatures are maintained in a range from about 25° C. to about 50° C., and in this example at about 40° C., and an etching time in a range from about 30 seconds to about 20 minutes, and in this example about 10 minutes.

The wet etch is carried out with a 5:5:2 mixture of NMP:TMAH:$H_2O_2$, provided in concentrations as set forth herein, and an about 3.69 gram/liter amount of KF is added. In this embodiment, the KF is added to TMAH and the $H_2O_2$ and the NMP are premixed. Thereafter, a point-of-use mixing is carried out such that the two mixtures are added as they are metered to a wet etch tool. The temperature of the etch is maintained at about 40° C. by proper stirring, recirculating etchant, and cooling thereof, and the etch time is about 10 minutes. The pH of the etching solution is maintained at about pH 12.

Thereafter, a thermal process acts that reflows bump precursor button 36 to form a solder ball (not pictured).

In a second example, all processing conditions are similar to the previous example, except mixing of the KF with the TMAH is the only premixture provided. In this example, the $H_2O_2$ and the NMP are provided separately and a point-of-use mixing is carried by blending the KF/TMAH mixture and the NMP and $H_2O_2$ in a three-part point-of-use blending as the three parts are metered to a wet etch tool.

In a third example, all processing conditions are similar to the previous example, except all four components are premixed and metered to the wet etching tool.

FIG. 7 is a process flow diagram of an embodiment. The process 700 includes forming 710 a metal first layer over a metallization as set forth herein. Processing continues by forming 720 a metal second layer over the metal first layer. According to one embodiment, a metal third layer is formed 730 over the second metal layer, and the metal third layer is the same metal or type as the metal first layer. In any event, a metal upper layer is formed 740 over the metal second layer, either above and on it, or above and on the metal third layer. An electrically conductive bump is formed 750 as set forth herein. Thereafter etching 760 of the BLM stack is carried out as set forth herein. In particular, a first wet etch is carried out that removes the metal upper layer everywhere except under the bump precursor button. A second wet etch is next carried out that removes the metal first- through metal third layers. Process control is used to maintain etch temperature, pH, and the oxidation conditions in order to prevent redeposition of any metallization onto the passivation layer or other structures.

According to the details set forth herein, an embodiment of the present invention relates to a BLM etching system. The BLM etching system includes a substrate including a metallization pad. The system also includes a BLM stack and a bump precursor button as set forth herein. The system also includes an etch recipe as set forth herein. In a specific embodiment, the BLM etching system includes NMP, TMAH, $H_2O_2$, and KF.

Additionally, according to details set forth herein, an embodiment of the present invention relates to a BLM etching solution including a nitrogen-containing heterocyclic compound, an ammonium hydroxide compound, an oxidizer, and a metal halide compound, wherein the solution has a pH greater than or equal to about 7.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

The invention claimed is:

1. A ball-limiting metallurgy (BLM) etching system comprising:
    a substrate including a metallization pad;
    a BLM stack including:
        a metal first layer disposed above and on the metallization pad;
        a metal second layer disposed above and on the metal first layer;
        a metal upper layer disposed above the metal second layer;
    an electrically conductive bump disposed above and on the BLM stack; and
    an etch recipe that includes:
        n-methyl pyrrolidone(NMP), tetra methyl ammonium hydroxide (TMAH), hydrogen peroxide ($H_2O_2$), and potassium fluoride (KF); and
        etching conditions that resist dissolving the electrically conductive bump.

2. The BLM etching system according to claim 1, wherein the etching conditions include NMP:TMAH:$H_2O_2$ in volume ratio ranges from about 8:5:2 to about 2:5:1, from about 5:6:2 to about 5:4:2, and from about 5:5:3 to about 5:5:1.

3. The BLM etching system according to claim 1, wherein the etching conditions include KF in a range from about 3 g/liter to about 5 g/liter.

4. The BLM etching system according to claim 1, wherein the etching conditions include an etching temperature in a range from about 25° C. to about 50° C.

5. The BLM etching system according to claim 1, wherein the etching conditions include an etch time in a range from about 30 seconds to about 20 minutes.

6. The BLM etching system according to claim 1, wherein the refractory metal upper layer is selected from a refractory metal, metal-doped refractory metal, or a refractory metal alloy selected from Ni, Co, Pd, Pt, NiV, CoV, PdV, PtV, Ti, Zr, Hf, Cr, Mo, W, Sc, Y, La, and Ce in a solid-solution or stoichiometric ratio.

7. The BLM etching system according to claim 1, wherein the electrically conductive bump comprises a tin-lead solder composition selected from Sn37Pb, Sn97Pb, and $Sn_xPb_y$, wherein x+y total 1 and wherein x is in a range from about 0.3 to about 0.99.

8. The BLM etching system according to claim 1, further comprising:
    a metal third layer disposed above and on the metal second layer, wherein the metal third layer is substantially the same metal as the metal first layer.

9. A ball-limiting metallurgy (BLM) etching system comprising a solution including a nitrogen-containing heterocyclic compound, an ammonium hydroxide compound, an oxidizer, and a metal halide compound, wherein the solution has a pH greater than or equal to about 7.

10. The BLM etching system according to claim 9, wherein the heterocyclic compound includes n-methyl pyrrolidone, wherein the ammonium hydroxide compound includes tetra methyl ammonium hydroxide, wherein the oxidizer includes hydrogen peroxide, and wherein the metal halide compound includes potassium fluoride.

11. The BLM etching system according to claim 9,
    wherein the heterocyclic compound includes about five volume parts n-methyl pyrrolidone;
    wherein the ammonium hydroxide compound includes about two volume parts 25% tetra methyl ammonium hydroxide in water;
    wherein the oxidizer includes about two volume parts 30% hydrogen peroxide in water; and
    wherein the metal halide compound includes about 4 gram/liter potassium fluoride in the solution.

12. The BLM etching system according to claim 9, wherein the solution is provided in two parts including:
    a first part containing the heterocyclic compound and the oxidizer; and
    a second part containing the ammonium hydroxide compound and the metal halide compound.

13. The BLM etching system according to claim 9, wherein the solution is provided in three parts including:
    a first part containing the heterocyclic compound;
    a second part containing the ammonium hydroxide compound and the metal halide compound; and
    a third part containing the oxidizer.

* * * * *